(12) United States Patent
Boroson et al.

(10) Patent No.: US 6,824,950 B2
(45) Date of Patent: Nov. 30, 2004

(54) FORMING AN OLED DEVICE WITH A PERFORMANCE-INHANCING LAYER

(75) Inventors: Michael L. Boroson, Rochester, NY (US); Liang-Sheng Liao, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 36 days.

(21) Appl. No.: 10/366,945

(22) Filed: Feb. 14, 2003

(65) Prior Publication Data

US 2004/0161695 A1 Aug. 19, 2004

(51) Int. Cl.$^7$ .......................... H01J 9/227; H05B 33/00
(52) U.S. Cl. .................. 430/200; 430/201; 430/319; 430/321; 428/690; 428/917; 313/504; 313/506
(58) Field of Search ................... 428/690, 917; 430/200, 319, 321, 201; 313/504, 506; 257/88, 40; 438/99

(56) References Cited

U.S. PATENT DOCUMENTS

| | | | |
|---|---|---|---|
| 5,937,272 A | 8/1999 | Tang | 438/30 |
| 6,603,139 B1 * | 8/2003 | Tessler et al. | 257/40 |
| 6,639,357 B1 * | 10/2003 | Parthasarathy et al. | 313/504 |

OTHER PUBLICATIONS

"A chemical failure mechanism for aluminum(III) 8–hydroxyquinoline light–emitting devices" by F. Papadimitrakopoulos, et al., Chem. Mater. 1996, 8, 1363–1365.

* cited by examiner

Primary Examiner—Dawn Garrett
(74) Attorney, Agent, or Firm—Raymond L. Owens

(57) ABSTRACT

A method for forming an organic light-emitting device with improved performance including forming an anode over a substrate and providing a donor element including light-emitting materials and positioning such donor element in a material-transferring relationship with the substrate. The device also including illuminating the donor element with radiation to cause the transfer of light-emitting material to deposit the light-emitting material and form a light-emitting layer the anode and forming a performance-enhancing layer over the light-emitting layer including one or more chemical reducing materials selected to improve the performance of the organic light-emitting device. The device further includes forming an electron-transporting layer over the performance-enhancing layer and forming a cathode over the electron-transporting layer.

16 Claims, 3 Drawing Sheets

FORMING AN OLED DEVICE WITH A PERFORMANCE-INHANCING LAYER

CROSS REFERENCE TO RELATED APPLICATIONS

Reference is made to commonly assigned U.S. patent application Ser. No. 10/060,837 filed Jan. 30, 2002 by Mitchell Burberry et al., entitled "Using Spacer Elements to Make Electroluminescent Display Devices"; commonly assigned U.S. patent application Ser. No. 10/055,549 filed Jan. 23, 2002 by David B. Kay et al., entitled "Using a Multichannel Linear Laser Light Beam in Making OLED Devices by Thermal Transfer"; and to commonly assigned U.S. patent application Ser. No. 10/366,835 filed Feb. 14, 2003 by Liang-Sheng et al., entitled "OLED Device with a Performance-Enhancing Layer"; the disclosures of which are herein incorporated by reference.

FIELD OF THE INVENTION

The present invention relates to organic electroluminescent (EL) devices, also known as organic light-emitting diodes (OLED) that emit color light.

BACKGROUND OF THE INVENTION

In color or full-color organic electroluminescent (EL) displays (also known as organic light-emitting diode devices, or OLED devices) an array of colored pixels is provided. These pixels can include red, green, and blue color pixels (commonly referred to as RGB pixels). These pixels are precision patterned. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer or light-emitting layer of the organic EL medium. Other organic layers present in the organic EL medium can provide charge transport functions primarily and are referred to as either the hole-transporting layer (for hole transport) or electron-transporting layer (for electron transport). In forming the RGB pixels in a full-color OLED display panel, it is necessary to devise a method to precisely pattern the emissive layer of the organic EL medium or the entire organic EL medium.

In commonly assigned U.S. Pat. No. 5,937,272, Tang has taught a method of patterning multicolor pixels (e.g. red, green, blue subpixels) onto a thin-film-transistor (TFT) array substrate by vapor deposition of an EL material. Such EL material is deposited on a substrate in a selected pattern via the use of a donor coating on a support and an aperture mask.

The EL material transfer is preferably done under conditions of reduced oxygen and/or water, using a chamber such as Tang describes in the aforementioned patent. The use of vacuum or reduced pressure can facilitate the transfer of the EL material from the source to the substrate. The use of such conditions during transfer is also advantageous in that some EL materials are sensitive to oxygen and/or moisture. For example, tris(8-quinolinolato)-aluminum(III) (Alq), which is used in OLED devices, is known to react with water [F. Papadimitrakopoulos et al, *Chem. Mater.* 8, 1363 (1996)]. In addition, many electrode materials used on both small molecule and polymer EL devices are extremely unstable in air. The use of a vacuum or low oxygen and/or water conditions during the transfer step can help reduce the failure rate of OLED devices. However, inadvertent contamination of the device by oxygen, moisture, and/or other components is possible during or between deposition steps or anytime there is an apparatus transfer or delay between steps. This can lead to reduced stability of OLED displays. In addition, radiation transfer of organic light-emitting materials can be a high energy process that can reduce the stability of OLED displays made by this method.

SUMMARY OF THE INVENTION

It is therefore an object of the present invention to improve the stability of an OLED device.

This object is achieved by a method for forming an organic light-emitting device with improved performance comprising the steps of:

a) forming an anode over a substrate;

b) providing a donor element including light-emitting materials and positioning such donor element in a material-transferring relationship with the substrate;

c) illuminating the donor element with radiation to cause the transfer of light-emitting material to deposit the light-emitting material and form a light-emitting layer over the anode;

d) forming a performance-enhancing layer over the light-emitting layer including one or more chemical reducing materials selected to improve the performance of the organic light-emitting device;

e) forming an electron-transporting layer over the performance-enhancing layer; and f) forming a cathode over the electron-transporting layer.

ADVANTAGES

It is an advantage of this invention that an OLED device manufactured by radiation transfer of a light-emitting material has improved operational stability.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" is used in its art-recognized meaning of a display device comprising organic light-emitting diodes as pixels and will also be referred to as an organic light-emitting device. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of producing light in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to produce blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1:
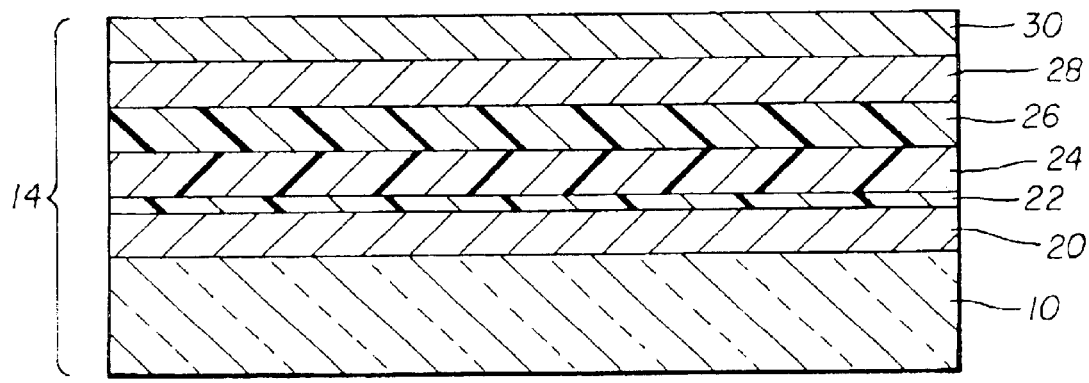
FIG. 1 shows a cross-sectional view of a prior art OLED device.

Turning now to FIG. 1, there is shown a cross-sectional view of a prior art OLED device. OLED device 14 includes substrate 10. Substrate 10 can be an organic solid, an inorganic solid, or a combination of organic and inorganic solids that provides a surface for receiving organic material from a donor. Substrate 10 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof Substrate 10 can be a homogeneous mixture of materials, a composite of materials, or multiple layers of materials. Substrate 10 can be an OLED substrate, that is a substrate commonly used for preparing OLED devices, e.g. active-matrix low-temperature polysilicon TFT substrate. The substrate 10 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light-absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

Anode 20 is formed over substrate 10. When EL emission is viewed through the substrate 10, anode should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 22 be formed over anode 20 in an organic light-emitting display. The hole-injecting material can serve to improve the film formation property of subsequent organic layers and to facilitate injection of holes into the hole-transporting layer. Suitable materials for use in the hole-injecting layer 22 include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

While not always necessary, it is often useful that a hole-transporting layer 24 be formed over hole-injecting layer 22, or over anode 20 if no hole-injecting layer is used. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 24 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

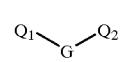

A wherein:
 $Q_1$ and $Q_2$ are independently selected aromatic tertiary amine moieties; and
 G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

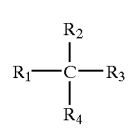

B where:
 $R_1$ and $R_2$ each independently represent a hydrogen atom, an aryl group, or an alkyl group or $R_1$ and $R_2$ together represent the atoms completing a cycloalkyl group; and
 $R_3$ and $R_4$ each independently represent an aryl group, which is in turn substituted with a diaryl substituted amino group, as indicated by structural Formula C.

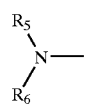

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

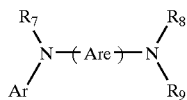

D wherein:
  each Are is an independently selected arylene group, such as a phenylene or anthracene moiety;
  n is an integer of from 1 to 4; and
  Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4'h-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-peryienyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

A light-emitting layer 26 producing light in response to hole-electron recombination is formed over anode 20 and over any other layers formed, such as hole-transporting layer 24. Desired organic light-emitting materials can be deposited by any suitable means such as evaporation, sputtering, chemical vapor deposition, electrochemical means, or radiation transfer from a donor material. Useful organic light-emitting materials are well known. As more fully described in U.S. Pat. Nos. 4,769,292 and 5,935,721, the light-emitting layer 26 of the organic EL element comprises a luminescent or fluorescent material where electroluminescence is produced as a result of electron-hole pair recombination in this region. The light-emitting layer 26 can be comprised of a single material, but more commonly includes a host material doped with a guest compound or dopant where light emission comes primarily from the dopant and can be of any color. The host materials in the light-emitting layer 26 can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

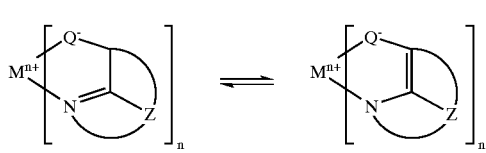

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(II)-$\mu$-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

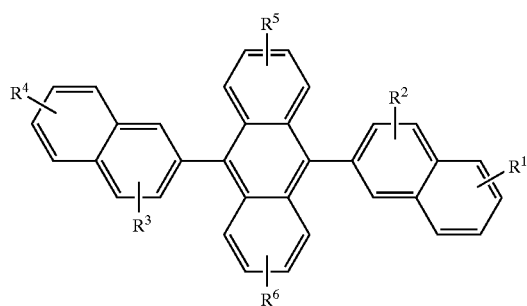

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

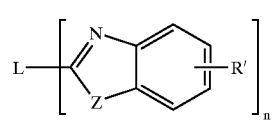

where:
n is an integer of 3 to 8;
Z is O, NR or S;
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

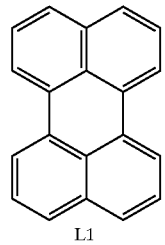

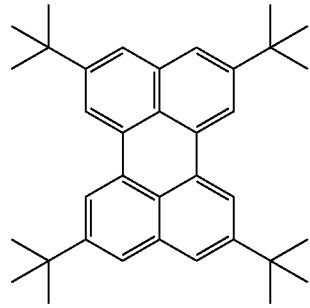
L2
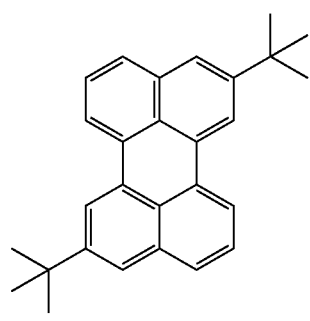
L3
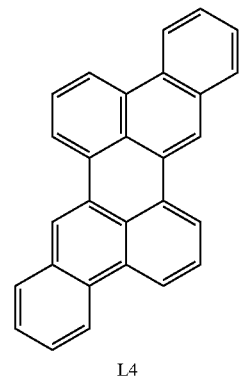
L4
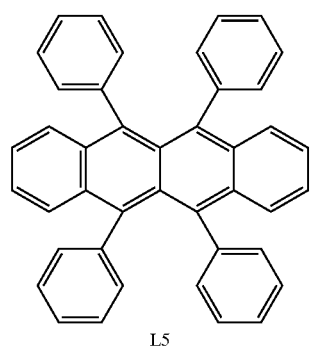
L5
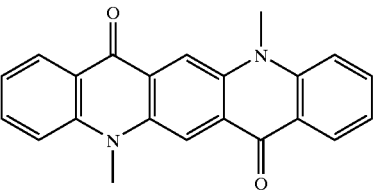
L6
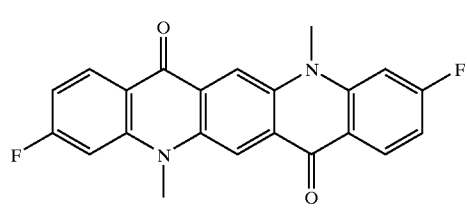
L7
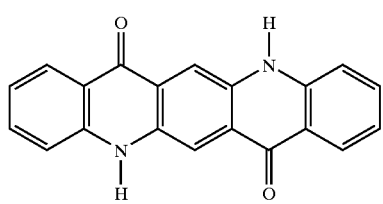
L8
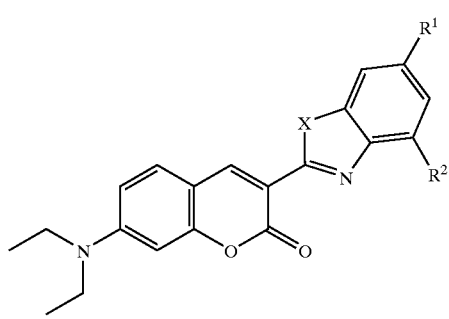
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

-continued
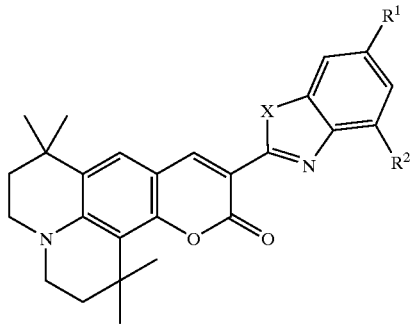
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
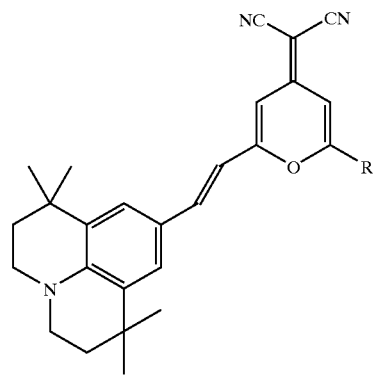
| | R |
|---|---|
| L37 | phenyl |
| L38 | methyl |
| L39 | t-butyl |
| L40 | mesityl |
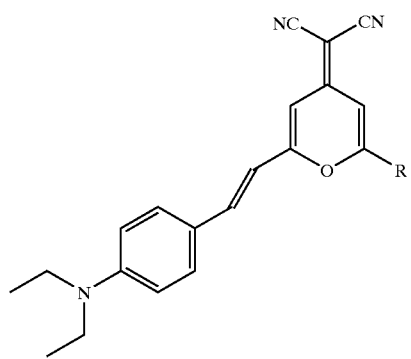
| | R |
|---|---|
| L41 | phenyl |
| L42 | methyl |
| L43 | t-butyl |
| L44 | mesityl |
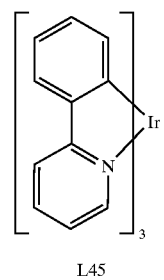
L45
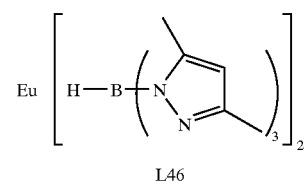
L46
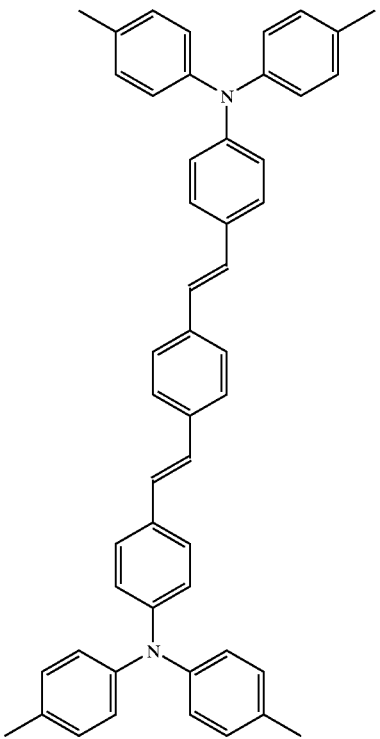
L47

-continued

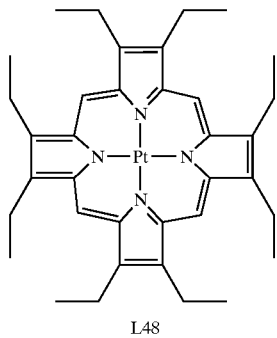

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Although not shown, light-emitting layer 26 can additionally comprise two or more emissive layers, if such is desired for proper emissive properties of the resulting OLED device.

Electron-transporting layer 28 is formed over light-emitting layer 26. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 28 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

Cathode 30 is formed over electron-transporting layer 28. When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Figure 2:
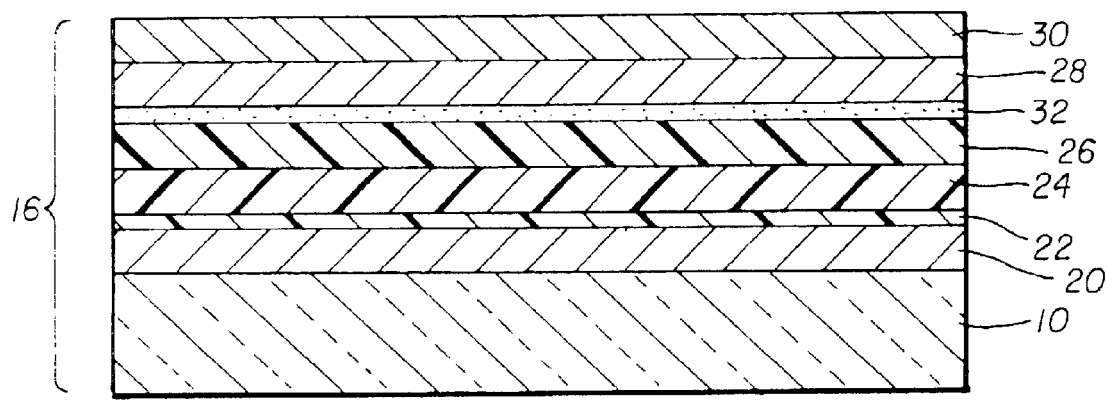
FIG. 2 shows a cross-sectional view of one embodiment of an OLED device prepared with a performance-enhancing layer over the light-emitting layer in accordance with this invention.

Turning now to FIG. 2, there is shown a cross-sectional view of one embodiment of an OLED device with improved performance prepared with a performance-enhancing layer over the light-emitting layer in accordance with this invention. Performance-enhancing layer 32 is formed over light-emitting layer 26 and under electron-transporting layer 28. Performance-enhancing layer 32 includes one or more chemical reducing materials selected to improve the performance of the OLED device 16. The term "chemical reducing materials" as used in this specification means that these materials have electron-donating properties. Performance-enhancing layer 32 can comprise a metallic material such as an alkali metal (e.g. lithium, sodium), an alkaline earth metal (e.g. barium, magnesium), or a metal from the lanthanide group (e.g. lanthanum, neodymium, lutetium) or combinations thereof. Performance-enhancing layer 32 can also comprise one or more organic chemical reducing materials, e.g. bis(ethylenedithio)tetra-thiafulvalene (BEDT-TTF), tetrathiafulvalene (TTF) or derivatives thereof Performance-enhancing layer 32 can be formed by two or more different materials sequentially deposited or codeposited, at least one of which is chosen from the above materials. The performance-enhancing layer 32 has a thickness of 0.01 to 1 nm, and preferably has a thickness of 0.02 to 0.5 nm if it comprises a metallic material. If performance-enhancing layer 32 comprises an organic chemical reducing material, it has a thickness of 0.1 to 2 nm, and preferably has a thickness of 0.1 to 1 m. Desired performance-enhancing materials can be deposited by any suitable means such as thermal evaporation, electron-beam evaporation, ion sputtering, or other film fabrication methods. In order to be compatible with the deposition of organic layers, performance-enhancing layer 32 is preferably formed by thermal evaporation. Performance-enhancing layer 32 is preferably deposited just before the deposition of electron-transporting layer 28.

Figure 3:
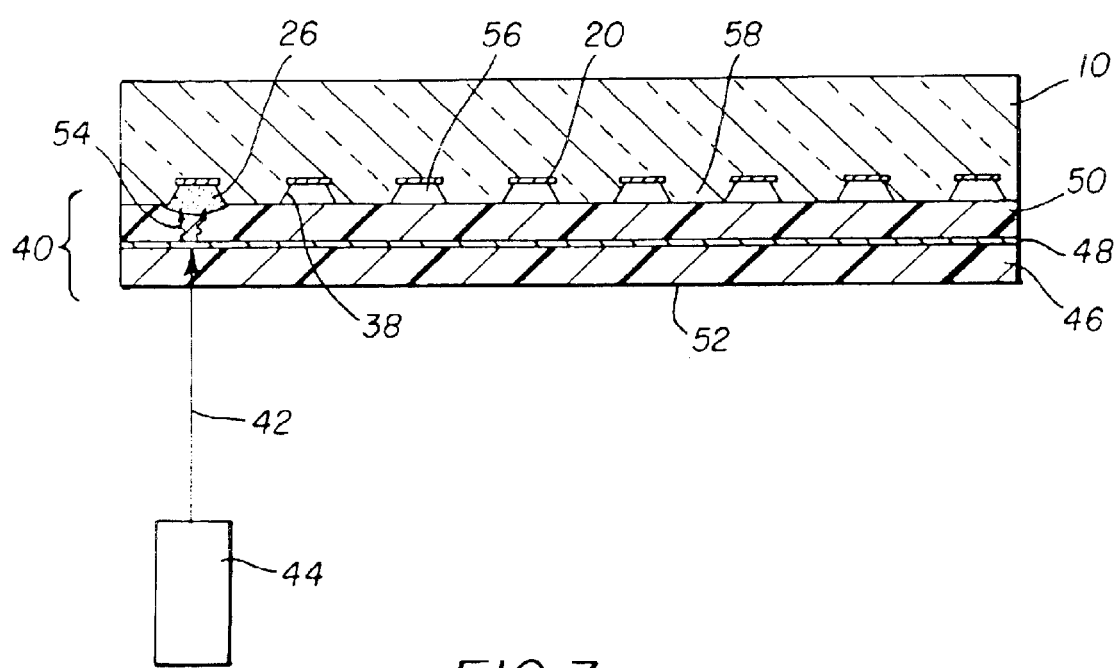
FIG. 3 shows a cross-sectional representation of the process of selectively transferring light-emitting material from a donor element to a substrate by radiation transfer.

FIG. 3 shows a cross-sectional representation of the process of selectively transferring light-emitting material 50 from donor element 40 to portions of substrate 10 by radiation transfer in one method of treatment with light. Radiation transfer is herein defined as any mechanism such as sublimation, ablation, vaporization or other process whereby material can be transferred upon initiation by radiation. Donor element 40 has been prepared with radiation-absorbing layer 48 over donor support element 46. Donor support element 46 has been described by Tang et al in commonly assigned U.S. Pat. No. 5,904,961. Radiation-absorbing layer 48 comprises radiation-absorbing material capable of absorbing light in a predetermined portion of the spectrum to produce heat.

Radiation-absorbing layer 48 can include a dye such as the dyes specified in U.S. Pat. No. 5,578,416, a pigment such as carbon, or a metal such as nickel, chromium, titanium, etc. Donor element 40 includes light-emitting material 50, also called an emissive layer, coated on the donor element.

Donor element 40 is positioned in a material-transferring relationship with substrate 10, which can be an OLED substrate. By material-transferring relationship, we mean that donor element 40 is positioned in contact with substrate 10 or is held with a controlled separation from substrate 10. In this embodiment, donor element 40 is in contact with substrate 10 and gap 56 is maintained by the structure of anodes 20 of thin-film transistors and intervening raised surface portions 58. Gap 56 has previously been described commonly assigned U.S. patent application Ser. No. 10/060, 837 filed Jan. 30, 2002 by Mitchell Burberry et al., entitled "Using Spacer Elements to Make Electroluminescent Display Devices", the disclosure of which is herein incorporated by reference. It will be understood that embodiments are possible in which there is no gap. Laser source 44 selectively illuminates non-transfer surface 52 of donor element 40 with radiation e.g. laser light 42. Laser source 44 can be e.g. an infrared laser of a power which is sufficient to cause enough heat 54 to be formed to effect the radiation transfer described herein. Radiation-absorbing layer 48 of donor element 40 absorbs laser light 42 and produces heat 54. Some or all of the heated portion of material coated on donor element 40 is sublimed, vaporized, or ablated and thus deposited to receiving surface 38 of substrate 10 in a patterned transfer. In this manner, light-emitting material 50 can be transferred to selectively form light-emitting layer 26. Thus, the vaporization transfer of host materials and dopant materials, which comprise the various layers of light-emitting material 50, is effected.

Figure 4:
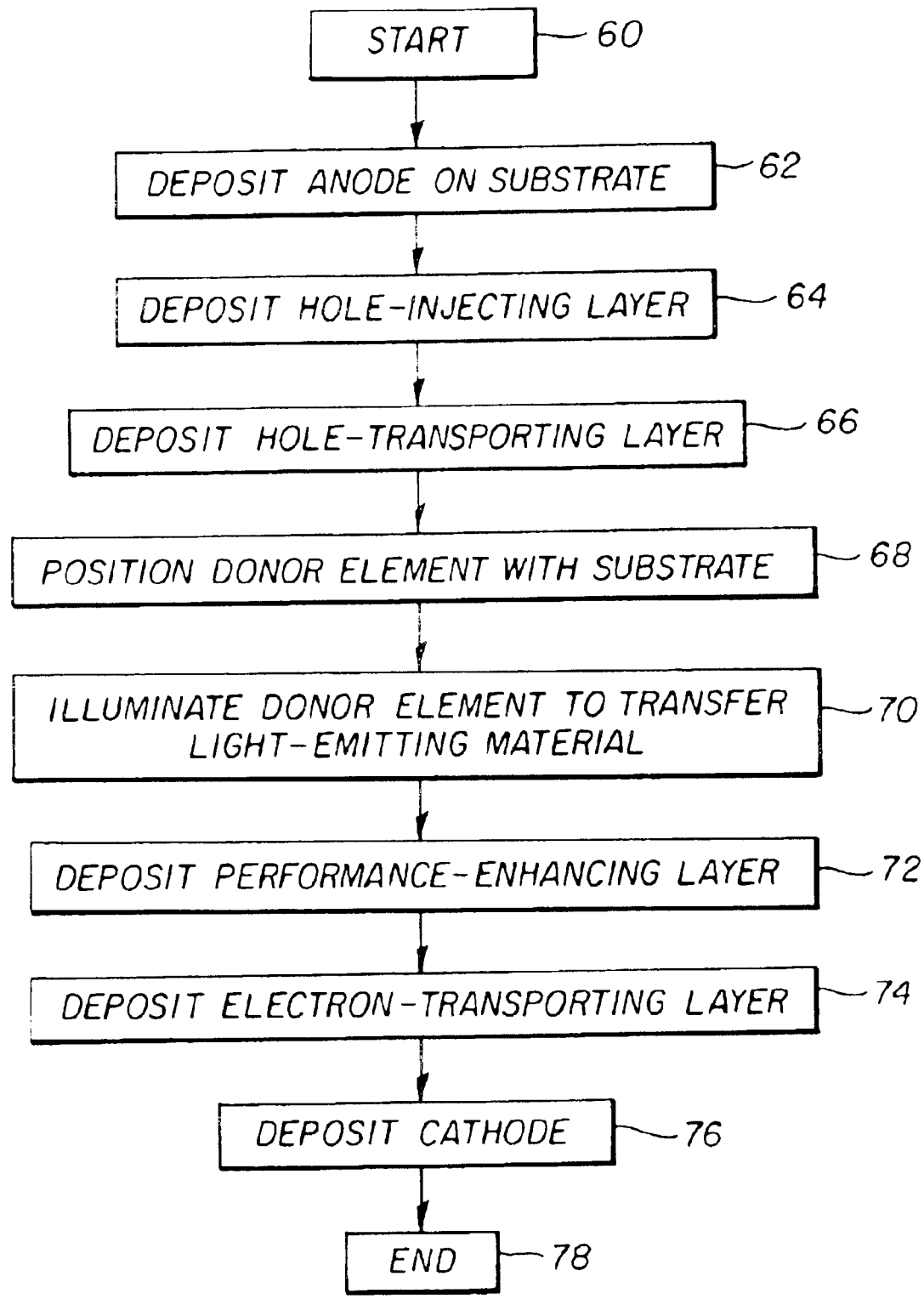
FIG. 4 is a block diagram showing the steps involved in a method according to the present invention.

Turning now to FIG. 4, and referring also to FIG. 2 and FIG. 3, there is shown a block diagram comprising the steps in one embodiment of a method for forming an organic light-emitting device according to the present invention. At the start (Step 60) of the process, anodes or patterns of anodes 20 are formed over the substrate 10 (Step 62). Alternatively, the anodes 20 can be part of the substrate 10, e.g. an OLED substrate. Then a hole-injecting layer 22 is optionally formed on the entire surface over anodes 20 (Step 64). Then a hole-transporting layer 24 is optionally formed on the entire surface over the hole-injecting layer 22 (Step 66). Then a donor element 40 is positioned in a material-transferring relationship with substrate 10 (Step 68). Donor element 40 is then illuminated with radiation, such as laser light 42, to heat donor element 40, deposit light-emitting material 50, and form light-emitting layer 26 over anode 20 and any intervening layers (Step 70). Then a performance-enhancing layer 32 in accordance with this invention is deposited over the light-emitting layer 26 (Step 72). The performance-enhancing layer 32 includes one or more chemical reducing materials selected to improve the performance of the organic light-emitting device, as described herein. The organic light-emitting device is then completed. An electron-transporting layer 28 is formed over performance-enhancing layer 32 (Step 74). Then a cathode layer or a series of cathodes 30 is deposited over the electron-transporting layer 28 (Step 76). There can be further steps, for example depositing a protective layer, before the end of the process (Step 78).

The invention and its advantages can be better appreciated by the following inventive and comparative examples.

EXAMPLE 1

Inventive Example

An OLED device with a performance-enhancing layer satisfying the requirements of the invention was constructed in the following manner:

1. A clean glass substrate was vacuum-deposited with indium tin oxide (ITO) to form a transparent electrode of 34 nm thickness.

2. The above-prepared ITO surface was treated with a plasma oxygen etch, followed by plasma deposition of a 1.0 nm layer of a fluorocarbon polymer (CFx) as described in U.S. Pat. No. 6,208,075.

3. The above-prepared substrate was further treated by vacuum-depositing under a vacuum of approximately $10^{-6}$ Torr a 170 nm hole-transporting layer of 4,4'-bis[N-(1-naphthyl)-N-phenylamino]biphenyl (NPB) from a heated boat source.

4. The above-prepared substrate was removed from the vacuum and exposed to air for about five minutes before being placed in a nitrogen drybox.

5. A donor substrate was prepared by vacuum coating 40 nm of chromium onto a 75 micrometer sheet of polysulfone.

6. The above-prepared donor substrate was further vacuum-coated with 20 nm of 2-(1,1-dimethyethyl)-9,10-bis(2-naphthalenyl)anthracene (TBADN) doped with 1.25% 2,5,8,11-tetra-t-butylperylene (TBP), then coated with an additional 0.8 nm of NPB to create a donor element.

7. The above-prepared donor element was removed from the vacuum and exposed to air for about five minutes before being placed in a nitrogen drybox.

8. The above donor element was placed in a material-transferring relationship with the substrate from Step 3 above using a spacer to maintain a 75 micrometer gap between the donor element and the substrate.

9. A multi-channel laser as described in commonly assigned U.S. patent application Ser. No. 10/055,579 filed Jan. 23, 2002 by David B. Kay et al., entitled "Using a Multichannel Linear Laser Light Beam in Making OLED Devices by Thermal Transfer", the disclosure of which is herein incorporated by reference, was used to illuminate the donor element with 755 mJ/cm$^2$ of energy to form the light-emitting layer over the hole-transport layer or the substrate.

10. The above substrate was exposed to the air for about 10 minutes, then returned to a vacuum.

11. A 0.1 nm performance-enhancing layer of lithium was evaporatively deposited onto the air-exposed Alq layer.

12. A 35 nm electron-transporting layer of tris(8-quinolinolato)-aluminum (III) (Alq) was vacuum-deposited onto the substrate at a coating station that included a heated boat source.

13. A 220 nm cathode layer was deposited onto the receiver element at a coating station with separate tantalum boats, one of which contained silver and one of which contained magnesium. The cathode layer was a 10:1 volume ratio of magnesium and silver.

14. The OLED device was then transferred to a dry box for encapsulation.

EXAMPLE 2

Comparative Example

An OLED device was constructed in the manner described in Example 1, except that Step 11 (the deposition of a performance-enhancing layer) was skipped.

EXAMPLE 3

Inventive Example

An OLED device was constructed in the manner described in Example 1, except that Step 12 (the deposition of an electron-transporting layer) was as follows:

12. A 35 nm electron-transporting layer of tris(8-quinolinolato)-aluminum (III) (Alq) with 1.2% lithium by volume (Alq:Li) was vacuum-deposited onto the substrate at a coating station that included two heated boat sources, one each for Alq and lithium.

Results

The devices in Examples 1–3 were tested by applying a constant current across the electrodes of 80 mA/cm$^2$ at room temperature and measuring the initial voltage and the time for the luminance to decrease to 50% of the initial luminance (80 mA/cm$^2$ half life). The relative voltage and relative half-life for to each example was then calculated relative to the comparative control of Example 2. The following table shows the results.

| Example (Type) | Lithium layer (nm) | Electron-transport layer (35 nm) | Relative Voltage @ 80 mA/cm$^2$ | Relative Half-Life @ 80 mA/cm$^2$ |
|---|---|---|---|---|
| 1 (Inventive) | 0.1 | Alq | 1.1 | 5.2 |
| 2 (Comparative) | — | Alq | 1 | 1 |
| 3 (Inventive) | 0.1 | Alq:Li | 0.9 | 5.7 |

It is evident that the device made without the performance-enhancing layer (Example 2) has a shorter half-life than the devices with the performance-enhancing layer (Examples 1 and 3). The addition of a thin lithium layer on the light-emitting layer increases the half-life by 5–6 times (see Examples 1, 2, and 3), thus giving improved performance of the device.

Although the addition of performance-enhancing layer as described in this invention, such as a thin layer of metal, can improve the stability, as in Example 1, the driving voltage necessary to maintain a given current density can increase (see Examples 1 and 2). However, when the electron-transporting layer is a doped Alq layer (Alq:Li), the use of a performance-enhancing layer can improve the stability while not raising the necessary driving voltage (see Examples 2 and 3). Therefore, the use of a performance-enhancing layer and an electron-transporting layer codeposited with an alkali metal is a preferred embodiment of this invention.

The invention has been described in detail with particular reference to certain preferred embodiments thereof, but it will be understood that variations and modification can be effected within the spirit and scope of the invention.

| PARTS LIST | |
|---|---|
| 10 | substrate |
| 14 | OLED device |
| 16 | OLED device |
| 20 | anode |
| 22 | hole-injecting layer |
| 24 | hole-transporting layer |
| 26 | light-emitting layer |
| 28 | electron-transporting layer |
| 30 | cathode |
| 32 | performance-enhancing layer |
| 38 | receiving surface |
| 40 | donor element |
| 42 | laser light |
| 44 | laser source |
| 46 | donor support element |
| 48 | radiation-absorbing layer |
| 50 | light-emitting material |
| 52 | non-transfer surface |
| 54 | heat |
| 56 | gap |
| 58 | raised surface portion |
| 60 | step |
| 62 | step |
| 64 | step |
| 66 | step |
| 68 | step |
| 70 | step |
| 72 | step |
| 74 | step |
| 76 | step |
| 78 | step |

What is claimed is:

1. A method for forming an organic light-emitting device with improved performance comprising the steps of:
   a) forming an anode over a substrate;
   b) providing a donor element including light-emitting materials and positioning such donor element in a material-transferring relationship with the substrate;
   c) illuminating the donor element with radiation to cause the transfer of light-emitting material to deposit the light-emitting material and form a light-emitting layer over the anode;
   d) forming a performance-enhancing layer over the light-emitting layer including one or more chemical reducing materials selected to improve the performance of the organic light-emitting device by reducing the effect of oxygen or moisture contamination of the light emitting layer;
   e) forming an electron-transporting layer over the performance-enhancing layer; and
   f) forming a cathode over the electron-transporting layer.

2. The method of claim 1 wherein the performance-enhancing layer includes one or more metallic chemical reducing materials selected from the group consisting of alkali metals, alkaline earth metals, and lanthanide metals, or one or more organic chemical reducing materials selected from bis(ethylenedithio)tetrathiafulvalene, tetrathiafulvalene, and their derivatives.

3. The method of claim 2 wherein the chemical reducing material includes lithium.

4. The method of claim 2 wherein the chemical reducing material includes barium.

5. The organic light-emitting device of claim 1 wherein the performance-enhancing layer includes a metallic chemical reducing material and has a thickness in a range of from 0.01 to 1.0 nm.

6. The organic light-emitting device of claim 5 wherein the performance-enhancing layer is deposited to have a thickness in the range of 0.02 to 0.5 nm.

7. The organic light-emitting device of claim 1 wherein the performance-enhancing layer includes an organic chemical reducing material and has a thickness in a range of 0.1 to 2 nm.

8. The organic light-emitting device of claim 7 wherein the performance-enhancing layer has a thickness in a range of 0.1 to 1 nm.

9. The method of claim 1 wherein the electron-transporting layer is codeposited with an alkali metal.

10. A method for forming an organic light-emitting device with improved performance comprising the steps of:
    a) forming an anode over a substrate;
    b) forming a hole-transporting layer over the anode;
    c) providing a donor element including light-emitting materials and positioning such donor element in a material-transferring relationship with the substrate;
    d) illuminating the donor element with radiation to cause the transfer of light-emitting material to deposit the light-emitting material and form a light-emitting layer over the hole-transporting layer;
    e) forming a performance-enhancing layer over the light-emitting layer including one or more chemical reducing materials selected to improve the performance of the organic light-emitting device by reducing the effect of oxygen or moisture contamination of the light emitting layer;

f) forming an electron-transporting layer over the performance-enhancing layer, and g) forming a cathode over the electron-transporting layer.

11. The method of claim 10 wherein the performance-enhancing layer includes one or more metallic chemical reducing materials selected from the group consisting of alkali metals, alkaline earth metals, and lanthanide metals, or one or more organic chemical reducing materials selected from bis(ethylenedithio)tetrathiafulvalene, tetrathiafulvalene, and their derivatives.

12. The method of claim 11 wherein the chemical reducing material includes lithium.

13. The method of claim 11 wherein the chemical reducing material includes barium.

14. The method of claim 10 wherein the performance-enhancing layer includes a metallic chemical reducing material and has a thickness in a range of from 0.01 to 1.0 nm.

15. The method of claim 14 wherein the performance-enhancing layer is deposited to have a thickness in the range of 0.02 to 0.5 nm.

16. The method of claim 10 wherein the electron-transporting layer is codeposited with an alkali metal.

* * * * *